United States Patent [19]
Felix et al.

[11] Patent Number: 5,935,390
[45] Date of Patent: Aug. 10, 1999

[54] PRODUCING CHLORINE AND HYDROGEN FROM HYDROGEN CHLORIDE BY PLASMA PROCESS

[75] Inventors: Vinci Martinez Felix, Kennett Square, Pa.; George Paskalov, Los Angeles, Calif.

[73] Assignees: E. I. du Pont de Nemours and Company, Wilmington, Del.; Plasma Plus, Van Nuys, Calif.

[21] Appl. No.: 08/804,159
[22] Filed: Feb. 20, 1997

Related U.S. Application Data

[60] Provisional application No. 60/012,510, Feb. 29, 1996.
[51] Int. Cl.$^6$ ....................................................... C01B 7/04
[52] U.S. Cl. ............................................. 204/164; 423/507
[58] Field of Search ............................... 204/164; 423/507

[56] References Cited

U.S. PATENT DOCUMENTS

| | | | |
|---|---|---|---|
| 3,205,162 | 9/1965 | Maclean | 204/164 |
| 3,464,787 | 9/1969 | Carson | 23/154 |
| 5,026,464 | 6/1991 | Mizuno et al. | 204/164 |
| 5,207,999 | 5/1993 | Burk et al. | 423/258 |

OTHER PUBLICATIONS

Meir et al., "Plasma Chemical Reactions of Hydrogen Chloride," Z. Chem. 14 (1974) vol. 11, pp. 452–453 (translation). (Month not available).

Chemical Abstract *1969:443,364.

Chemical Abstract *1975:124,236.

*Primary Examiner*—Kishor Mayekar
*Attorney, Agent, or Firm*—James E. Shipley

[57] ABSTRACT

A process is disclosed for converting hydrogen chloride (HCl) to molecular chlorine (Cl$_2$) and molecular hydrogen (H$_2$), and more particularly to such process conducted in a plasma environment.

17 Claims, 3 Drawing Sheets

PRODUCING CHLORINE AND HYDROGEN FROM HYDROGEN CHLORIDE BY PLASMA PROCESS

CROSS-REFERENCE TO RELATED APPLICATION

This application claims the priority benefit of U.S. Provisional Application Ser. No. 60/012,510 filed Feb. 29, 1996.

FIELD OF THE INVENTION

The instant invention relates to a process for converting hydrogen chloride (HCl) to molecular chlorine (Cl$_2$) and molecular hydrogen (H$_2$), and more particularly to such process conducted in a plasma environment. Chlorine has a multitude of uses including the manufacture of various chlorine-free as well as chlorine-containing chemicals of commerce, bleaching a wide variety of compositions including wood pulp and paper, treating water and sewage, among other uses. Molecular H$_2$ likewise has broad utility as a fuel, a reagent for reducing metal, producing metal hydrides including interstitial metal-hydrogen compositions, producing a wide variety of hydrogen containing inorganic as well as organic compounds, among other uses.

BACKGROUND OF THE INVENTION

Industries manufacturing C$_1$ and C$_2$ chlorohydrocarbons such as tetrachloroethylene (PCE), 1,2-dichloroethane (EDC), trichloroethylene (TCE), vinyl chloride (VCM), among others; toluenediisocyanate (TDI), 4,4 diisocyanodiphenyl methane (DME), fluorochemicals and fluoropolymers typically produce anhydrous hydrogen chloride as a by-product. When manufacturing fluorochemicals, generally via halogen exchange reactions, the resulting reaction product mixture is distilled thereby recovering anhydrous HCl, such as is described in U.S. Pat. Nos. 2,450,414; 2,450,415; and 2,478,362 to Benning.

U.S. Pat. No. 5,411,641 discloses an electrochemical process in which anhydrous HCl is oxidized at the anode to dry Cl$_2$ and protons; the protons are transported through a cation-transporting membrane, and reduced at the cathode to H$_2$. Cooper et al., I&EC Fundamentals, Vol. 7, No. 3, August 1968, pages 400–409, disclose oxidizing HCl with O$_2$ to produce Cl$_2$ plus H$_2$O by using a microwave discharge. D. J. Serry et al., The Journal of Chemical Physics, V. 48, No. 9, (1968) pages 4315–4317 discloses dissociating HCl by using vacuum ultraviolet absorption spectroscopy. E. S. Fishburne, The Journal of Chemical Physics, V. 45, No. 11 (1966) pages 4053–4056 also discloses dissociation of hydrogen chloride. T. A. Jacobs et al., The Journal of Chemical Physics, V. 46, No. 5 (1967) pages 1958–1968 disclose the kinetics of hydrogen halides in shock waves.

SUMMARY OF THE INVENTION

The present invention relates broadly to a process for producing hydrogen and chlorine from hydrogen chloride which comprises the steps of:
(i) introducing HCl into a plasma environment under conditions effective to convert at least a portion of the HCl into its constituents;
(ii) cooling the constituents to form a gas product mixture comprising H$_2$ and Cl$_2$; and
(iii) recovering the gas product mixture.

DETAILED DESCRIPTION OF THE INVENTION

Figure 1:
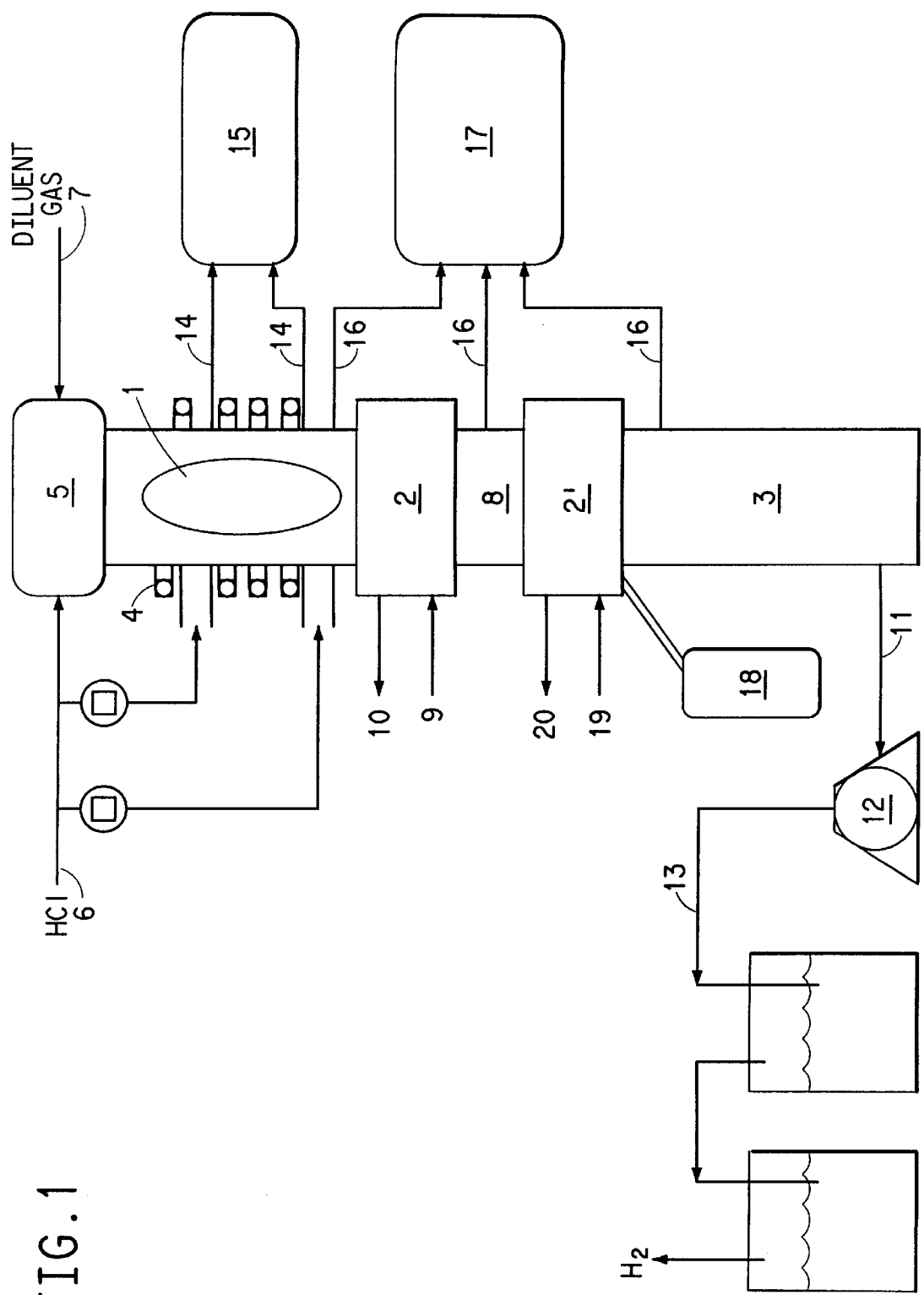
FIG. 1 is a partial schematic sectional elevation of an apparatus useful in carrying out the present invention in which an induction heating means is used to generate a plasma.

The present invention relates to an essentially one-step process for converting substantially anhydrous HCl to molecular Cl$_2$ and H$_2$. Typically, the substantially anhydrous HCl precursor contains less than about 5% by wt of water and normally less than about 1 wt % water. The HCl precursor can also be an impure by-product from a process for making C$_1$ and C$_2$ chlorohydrocarbons, e.g., HCl containing one or more of VCM, TDI, MDI, PCE, TCE, COCl$_2$, HF, and chlorofluorocarbons, among others. In the conversion process of this invention, a plasma is used as a conversion environment or medium. In a preferred embodiment, the process comprises the steps of:
(i) introducing HCl in the substantial absence of oxygen (O$_2$), i.e. about 5 to less than about 1 vol. % of O$_2$, into a plasma environment under conditions sufficient to convert HCl into its constituents;
cooling a product exiting the plasma environment to form a gas product mixture comprising or consisting essentially of Cl$_2$ and H$_2$; and
recovering the gas product mixture.
In some cases, the recovered gas product mixture may contain relatively small quantities of C$_1$ and/or C$_2$ hydrocarbon or halohydrocarbon impurities; e.g. less than 500 ppm thereof.

In a more preferred embodiment, HCl is introduced to the plasma environment as a feed mixture with one or more inert plasma-forming or compatible gaseous diluent such as argon, helium, neon, krypton, xenon, among others; feeding the HCl or said HCl feed mixture into the plasma-generating zone of a radio frequency (RF) induction plasma generator; maintaining the HCl under the conditions defined above in the above-described steps (i) and (ii) until at least a major proportion of the HCl, more preferably at least about 90% of the HCl feed and most preferably at least 95 of the HCl feed, has been converted to H$_2$ and Cl$_2$.

If desired, the converted hydrogen and chlorine can be separated from the product stream and each other by using any suitable chemical or physical means. An example of a suitable means is described in U.S. Pat. No. 3,464,787 (the disclosure of which is incorporated herein by reference), and by T. P. Tiberi and D. J. Brose in "Membrane Separation Technologies Offer Cost-Effective Onsite Recycling Options", Environmental Solutions, pps 42–43 (February 1995).

The inventive process involves converting a HCl-containing precursor into its monoatomic hydrogen and chlorine substituents within a plasma environment, e.g., an argon-containing plasma generator or reactor. Without wishing to be bound by any theory or explanation, it is believed that the HCl within the plasma environment is dissociated thereby permitting the Cl and H constituents of HCl to recombine and form a gas product stream comprising Cl$_2$ and H$_2$. It is believed that the overall transformation is represented by the equation:

$$HCl \rightarrow Cl_2 + H_2$$

More specifically, the conversion of HCl can be performed in a plasma environment produced by a plasma generating zone of a plasma generator which is operated under conditions that are sufficient to convert the HCl into a product stream comprising chlorine and hydrogen. For example, the plasma is operated in a manner that causes decomposition or dissociation of HCl into its constituents, e.g., which may exist as atomic species, unchanged free radicals and/or ionized species such as H+ cations and free electrons. Typically, the HCl conversion is performed in a plasma generator operated at a temperature of about 2,400 to about 6,000° K, a pressure of about 0.11 to about 5 atmospheres, and a power setting of about 5 to about 1,000 kW. Recombination of the H and Cl constituents of HCl into molecular $H_2$ and $Cl_2$ can be achieved by cooling the product stream exiting the plasma environment. For example, the product stream can be cooled by being introduced into a relatively cool zone of the plasma generator, e.g., a heat exchanger, and cooled to a temperature less than about the HCl conversion temperature, e.g., the HCl dissociation temperatures or about 2,200 to about 5,600° K. By cooling the gas product stream, $Cl_2$ and $H_2$ can be obtained in high yields such that typically at least about 95 to about 99% by weight of the HCl is converted into chlorine and hydrogen. Normally, the product stream excluding any diluent will comprise about 2.6 to about 2.7% by weight hydrogen and the remainder chlorine. The capability of the inventive process to convert HCl into $Cl_2$ and $H_2$ in such high yields is surprising when considering the bond dissociating energies of HCl and $H_2$, viz. about 104 kilocalories/mole for $H_2$ and about 103 kilocalories/mole for HCl.

Gaseous $H_2$ and $Cl_2$ do not react at normal temperatures in the absence of light. However, at temperatures above 250 degrees C., or in the presence of of sunlight or artificial light of ~470 nm wavelength, they combine explosively. Explosive limits of mixtures of pure gases are ~8 vol % $H_2$ and ~12 vol % $Cl_2$. These limits depend on temperature, pressure and concentration, and can be altered by adding inert gases such as $N_2$ or $CO_2$.

The temperatures within the plasma zone of the plasma generator are normally greater than about 2400 degrees Kelvin (°K), typically at least about 3600° K, and usually about 4500 to 5000° K range; with temperatures in excess of about 6000° K being acceptable for usage in the inventive process. The actual temperatures within the plasma environment can be determined by using either enthalpy calculations, or a probe. The probe method is described by J. Grey et al., in "Instr. Soc. Amer. Trans.", v. 4, No. 2. p.102 (1965). Generally, an increase in the plasma temperature causes an increase in the conversion of HCl, i.e., an increase in the yield of $Cl_2$ and $H_2$. Plasmas having temperatures effective for the present purpose may be generated by any suitable means including D.C. (direct current) heating means, microwave heating means, radio frequency (RD) induction heating means, among other suitable means for creating a plasma environment. Examples of suitable plasma generators are disclosed in Murdoch et al. U.S. Pat. No. 3,625,846, Hambley et al. U.S. Pat. No. 3,723,290, and Mizuno et al. U.S. Pat. No. 5,026,464; the disclosures of which are incorporated herein by reference.

The reaction pressure may vary widely and may be subatmospheric, atmospheric or superatmospheric; typically atmospheric for ease of operation. The HCl precursor feed rate to the plasma-generating zone is not a critical aspect of the inventive process. Typically, and depending upon the particular apparatus being employed, the rate at which the HCl is introduced as a gas into the plasma environment or zone is generally in the range of from about 10 to 100 meters per second, usually between about 20 to 60 m/sec. Depending upon the temperature of the plasma zone and HCl flow rate, the residence time of the HCl precursor feed stream within the plasma-generating zone can be relatively short. In general, the higher the temperature, the shorter the residence time; normally in the range of from about $1 \times 10^{-1}$ to about $1 \times 10^{-5}$ second, typically $1 \times 10^{-3}$ to about $1 \times 10^{-4}$ second. By employing suitable combinations of HCl feed rate, optional diluent quantity, plasma temperature and reaction time within the plasma-generating zone, the inventive process can be tailored to obtain a virtually unlimited array of results. Advantageously, the reaction conditions are controlled such that at least a major proportion of the HCl fed to the plasma-generating zone is converted into $Cl_2$ and $H_2$, typically at least about 90% and preferably substantially completely converted; i.e. at least 95% converted.

Dissociation of HCl under the above conditions can be monitored spectroscopically by using the characteristic Balmer series lines to establish the presence of H in the plasma gas stream. A more detailed discussion of the Balmer series lines can be found in "Plasma Diagnostic Techniques", Edited by R. H. Huddlestone and S. Leonard, Academic Press, (1965), p.230.; the disclosure of which is hereby incorporated by reference. Dissociation is conveniently done by monitoring the plasma stream after the stream exits the plasma-generating zone, and before the stream cools to become a product stream comprising or consisting essentially of $Cl_2$ and $H_2$. Similarly, the presence and relative proportions of $Cl_2$ and $H_2$ in the product stream can be ascertained by employing conventional physical and/or chemical means. For example, the stream can be sampled and analyzed in accordance with conventional gas chromatograph or spectrography techniques. If desired, conventional spectrograph and gas chromatographic analysis means may operationally be connected to a means for controlling the plasma environment thereby achieving an automated system that controls the reaction conditions and adjusts the conditions accordingly to ensure a desired degree of HCl conversion.

In a preferred embodiment of the invention, a precursor comprising HCl is introduced into the plasma environment wherein the precursor has been diluted with an "inert" plasma-forming or plasma-sustaining gas. By "inert diluent" is meant a diluent that avoids adversely affecting HCl dissociation, constituent recombination or product recovery steps of the inventive process. Examples of suitable diluents comprise one or more non-oxygenated substances such as He, Ne, Ar, Kr, Xe, combinations thereof with $H_2$, among suitable substances. By "non-oxygenated" substances, is meant to exclude substances containing undesirable quantities of oxygen such as $O_2$ itself, $H_2O$, CO, $CO_2$, among others. While the diluent may contain limited quantities of certain oxygenated substances, for best results, the amount of undesirable oxygenated substances is less than about 0.1% by weight based upon the HCl precursor being introduced into the plasma environment. Also, for best results, any diluent that contains hydrogen should also includes a quantity of another substance that is effective at reducing, if not eliminating, any hazard associated with hydrogen, e.g., flammability. Monoatomic gases, especially Ar, are particularly desirable diluents due to its relative inertness and availability. It is also desirable for the diluent to be more volatile than chlorine. Without wishing to be bound by any theory or explanation, it is believed that the diluent functions to provide a gas product stream wherein $Cl_2$ and $H_2$ are less likely to react or reform HCl. However, the invention has been carried out successfully in the absence of Ar or other diluent. The diluent is ordinarily used in an amount from about 0.1 to 2 parts by weight of the HCl introduced into the plasma-generating zone, usually from about 0.5 to 2 parts per part, and normally about 1 part per part of the HCl. In some cases, the product stream exiting the plasma zone comprises hydrogen, chlorine and a diluent. The product stream can be recovered as a useful product. Alternatively, it may be desirable to separate $H_2$ and any diluent from $Cl_2$, wherein trace amounts of $H_2$ could be recycled to the plasma-generating zone along with fresh HCl to be converted. That is, the trace amount of recycled hydrogen can function as a contaminant component of the diluent during subsequent HCl conversions.

In another embodiment of the invention, a product stream, which was obtained by cooling or quenching a plasmolyzed composition comprising one or more molecular products, can be separated into its components (including any diluent) by employing a physical or chemical means. For example, a gas product stream consisting essentially of $Cl_2$, $H_2$ and a diluent gas such as Ar can be cooled rapidly to produce a liquid phase consisting essentially of $Cl_2$ (b.p. $-34°$ C., m.p. $-101°$ C.), and a gas phase consisting essentially of $H_2$ and diluent gas(es). By "quenching" it is meant that the plasma stream is cooled at a rate of at least about $1 \times 10^{+3°}$ K per second, e.g., from about $1 \times 10^{+3}$ to $10^{+7°}$ K/sec. The phases are then separated by using conventional methods such as by vapor phase membrane separation, e.g., by passing the cooled stream through a hollow fiber membrane module. The separated gas phase may be fractionated to recover $H_2$, or recovered as a useful product. Alternatively a gas phase comprising $H_2$ and diluent can be employed as a hydrogenating or reducing agent wherein the inert diluent component of the gas phase would remain unchanged (and if desired could be recovered subsequently).

Molecular $Cl_2$ and $H_2$ can cause an explosion hazard. Consequently, the step of separating a product stream comprising hydrogen and chlorine into individual phases should be conducted expeditiously. For example, by passing the gas product stream through a deep-cooling heat exchanger which is effective at cooling the stream in a manner that causes the chlorine component to condense into a liquid. The condensation temperature is preferably below the $Cl_2$ boiling point, but higher than that of $H_2$, e.g., less than about $-34°$ C. and higher than about $-252.7°$ C. Typical, deep-cooling heat exchange media include solid $CO_2$-diethyl carbitol ($-52°$ C.), solid $CO_2$-acetone ($-77°$ C.), liquid $N_2$-methanol ($-98°$ C.), liquid $N_2$—$CS_2$ ($-110°$ C.), liquid $N_2$ n-pentane ($-131°$ C.), liquid Ar ($-186°$ C.), liquid $N_2$ ($-196°$ C.), and other cooling media which provide temperatures below $-34°$ C.

As discussed above, a mixture comprising hydrogen and one or more diluents can be recovered from the product stream exiting the plasma generator as a useful product, or separated into its constituents. The diluent boiling point may be lower, higher, or substantially the same as that of $H_2$. Typically, the diluent boils at a temperature higher than $H_2$ thereby facilitating the separation and recovery of $H_2$ from the product stream via condensation and fractional distillation steps. Alternatively, separation and recovery of $H_2$ can be achieved by using a diluent such as argon that quenches the gas product stream. When employing diluent gases such as Ar, Kr, He, and Xe, conventional fractional distillation is sufficient to separate and recover $H_2$. Chemical reaction means may be used alone or in conjunction with distillation methods for separating $H_2$ from the diluent. For example, $H_2$ can be separated from a diluent-containing mixture by utilizing the reduction potential of $H_2$ in a catalytic hydrogenation of unsaturated or other reducible compounds; wherein $H_2$ is consumed in the hydrogenation and the diluent can be recovered subsequently as unchanged by product. Separation by a chemical reaction method is typically employed when the $H_2$/diluent gas stream contains one or more diluent gases having boiling points relatively close to $H_2$, e.g., the boiling points of He, Ne, and render separation by fractional distillation impractical.

Similarly, if desired, a gas product mixture exiting the plasma generating zone that contains $Cl_2$, $H_2$ and a diluent may be separated by chemically removing $Cl_2$. For example, the gas mixture may be used in any bleaching operation wherein $H_2$ and the diluent gas are relatively inert, e.g. wood pulp bleaching, an addition reaction with a suitable unsaturated compound, such as $CHCl=CH_2$, thereby producing a chlorinated derivative (e.g., $CHCl_2CCl_3$.) The bleaching operation removes chlorine, thereby producing a residual stream containing hydrogen. The residual gas from such chemical processes, which consists essentially of $H_2$ and a diluent gas, may be separated from one another by physical or chemical means by using the separation processes described above. Chlorine may also be removed selectively from the gas product mixture by being scrubbed with an appropriate medium such as activated carbon. The solvent can be separated from the chlorine by using conventional distillation methods.

Certain aspects of the instant invention may be better understood by reference to the accompanying Figures.

Referring now to FIG. 1, a plasma-generating zone 1 communicates with coextensive plasma-cooling zone 2, which in turn communicates through conduit 8 with cooling device 2' which communicates in turn with gas product zone 3. Zone 1 can comprise a cylindrical quartz tube about 1 to 10 inches in diameter and about 10 to 50 inches long. Zone 1 is wrapped with an induction heating coil 4 which is connected to a source of radio frequency power (not shown), and is surmounted by and communicates with gas mixing chamber 5, which in turn is in fluid connection with HCl gas feed line 6 and diluent gas feed line 7. Coolants were circulated through cooling zone 2 via lines 9 and 10 and through cooling device 2' via lines 19 and 20. Liquid chlorine product is directed from cooling device 2' to collection means or trap 18. Gas product zone 3, which may be composed of any suitable inert material other than quartz, e.g., glass, is equipped with exit line 11 for conveying a gas product stream out of the plasma apparatus via pump 12 and line 13 to a gas product stream separation and recovery system shown schematically.

Optionally, the plasma-generating zone 1 is equipped with plasma gas viewing means 14, such as an optical fiber, which is located below or adjacent to heating coil 4, and operably connected to a conventional spectroscope 15 for analyzing the plasma temperature distribution. Likewise, plasma-generating zone 1, conduit 8, and/or gas product zone 3 are advantageously equipped with sampling means, e.g., line 16 leading to gas chromatograph 17 for determining the composition of the gas product stream produced by cooling the plasma composition.

The plasma-generating zone 1 can be comprised of any suitable material that is resistant to the plasma environment and the materials therein. Examples of suitable materials comprise at least one member from the group of quartz, tantalum, niobium, alloys of tantalum with Nb, Re, Os, Mo, Sr, and Ru, alloys of niobium with Re, Os, Mo, Ir, and Ru, among others.

Figure 2:
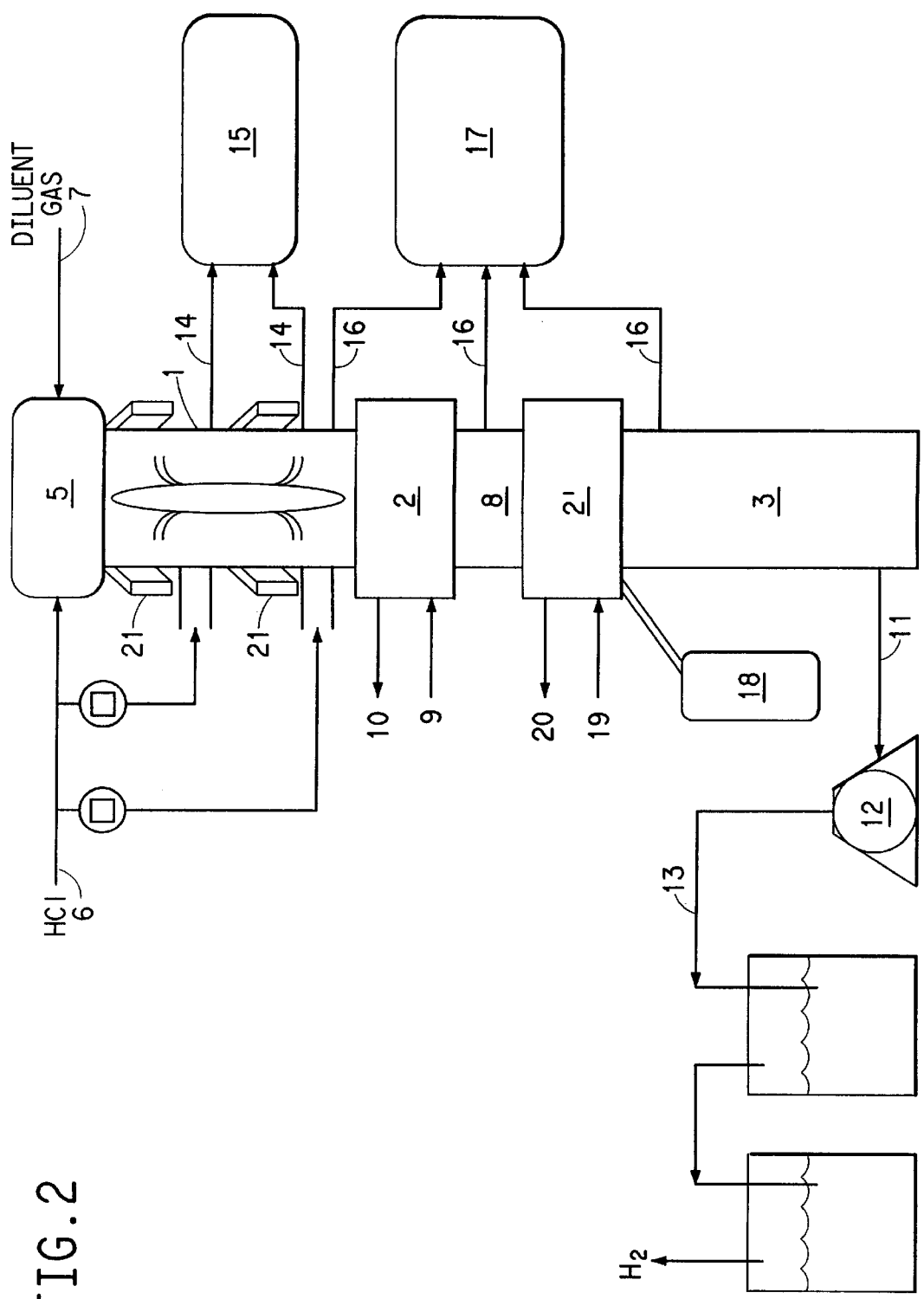
FIG. 2 is partial sectional schematic elevation of an apparatus useful in carrying out the present invention in which a capacitive heating means is used to generate a plasma.
Figure 3:
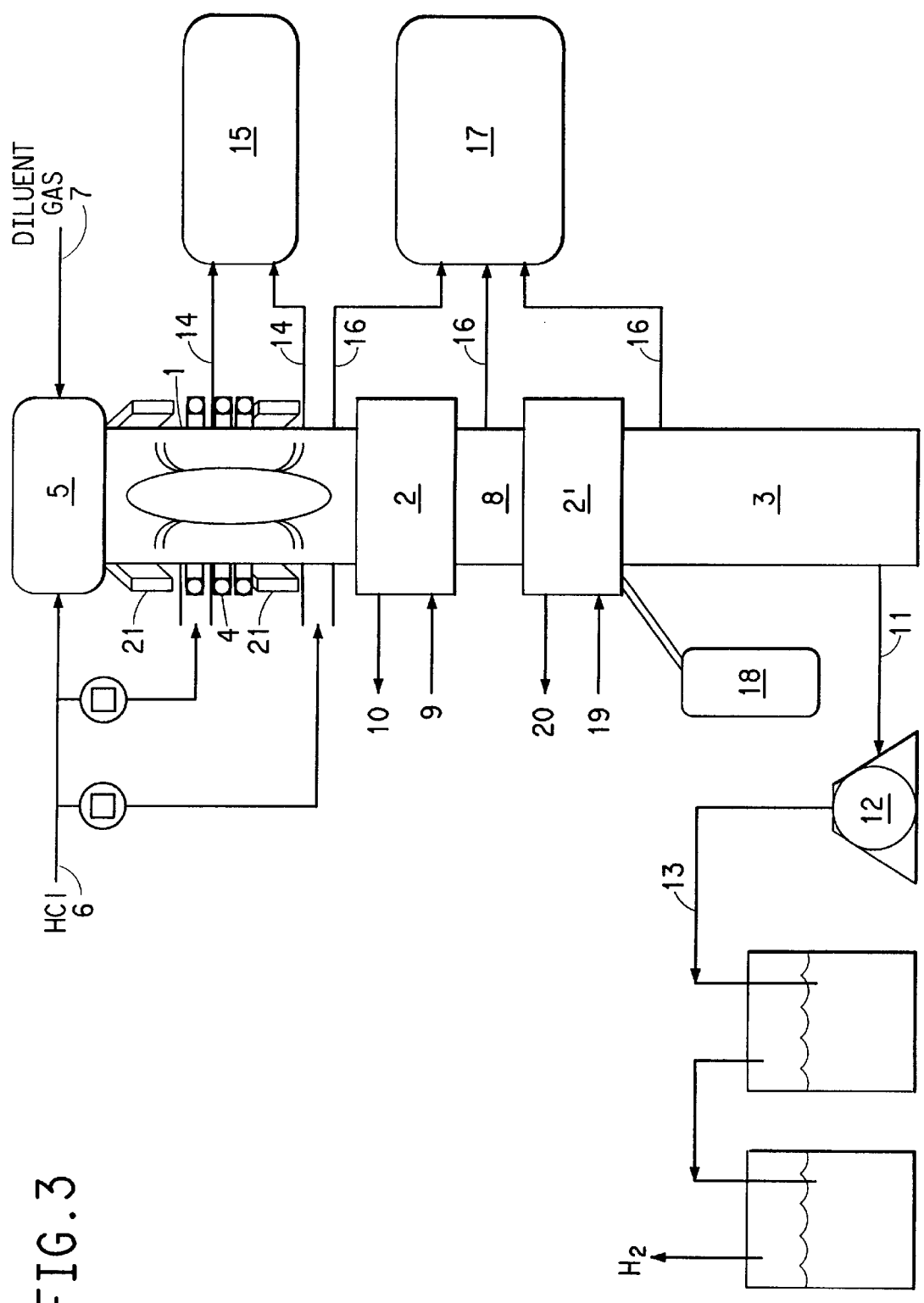
FIG. 3 is a partial sectional schematic elevation of an apparatus useful in carrying out the present invention in which a combination of an inductive means and a capacitive means is used to generate a plasma.

Referring now to FIGS. 2 and 3, these Figures illustrate employing differing means for generating an RF plasma;

they are otherwise identical to the apparatus shown in FIG. 1. FIG. 2 illustrates a capacitive plasma generation means 21 that creates a plasma characterized by non-equilibrium plasma, whereas FIG. 3 shows an apparatus that combines the inductive plasma generation means 4 of FIG. 1 with the capactive plasma generation means 21 of FIG. 2. The apparatus of FIG. 3 thereby gains the advantages of both inductive and capacitive plasmas properties.

While the previous description places particular emphasis upon a process for converting HCl into chlorine and hydrogen, it is important to note that a wide range hydrogen and/or chlorine sources or precursors thereof can be employed in the instant invention. For example, the HCl starting material or a precursor thereof can comprise a waste stream from another process. Further, a wide range of diluents, solvents, among other additives can be employed when practicing the instant invention. The following examples are provided to illustrate certain aspects of the instant invention and do not limit the scope of the invention defined in the appended claims.

EXAMPLES

In the following Examples, the plasma generator employed was an RF induction plasma apparatus represented schematically in FIG. 1 with power rating of up to 60 kW and a working frequency of 13.56 MHz Model RFG8-60/13 supplied by LOEZ, Russia which is equivalent to a Model T-60-3-MC supplied by LEPEL, USA. The plasma discharge power Pd was calculated in accordance with the following method:

$$Pd = I_{ao}*E_{ao} - Pa - Pic - Pad,$$

where:

$I_{ao}$=direct current of high voltage rectifier;

$E_{ao}$=voltage of anode plate;

$P_a$=the power losses on the liquid cooled vacuum tube anode, $$P_a = C_p*(T2-T1)*G,$$

where

T2=the temperature of cooling liquid at the anode outlet;

T1=the temperature of cooling liquid at the anode inlet;

G=the consumption of cooling liquid;

Cp=the specific heat capacity of cooling liquid;

Pic=the power losses on the inductive coil, which were measured by calorimeter method;

Pad=the additional losses of plate power which were estimated in the energy balance experiments.

Temperatures are in degrees Kelvin (°K), and were developed by varying the discharge power Pd from about 5 to 60 kW. The temperatures developed within the plasma generating zone were measured independently by combining two methods: enthalpy and the so-called Grey probe. The average temperature of the plasma environment was estimated in formula:

$$Tp1 = Pd/(C_p*G),$$

wherein:

Pd=plasma discharge power, kW;

G=total consumption of gas flow in the plasma generating zone, including but not limited to HCl and diluent gas, gram per second;

Cp=the average specific heat capacity of gas mixture at the plasma temperature (J/(gram*K):

Cp is an iteration of the formula $a1*Cp(HCl)+a2*Cp(Ar)$ where $Cp_{(HCl)}$ and $C_{p(Ar)}=f(T)$; a1, a2–the weight portion of the constituents of plasma gas mixture.

The second method for temperature employs a Grey probe. The integral procedure was applied and the average temperature of the plasma environment was obtained and compared with the value of average temperature which was obtained by the first method. A Conventional gas chromatograph (Model Gasochrom-7, Russia, equivalent of Hewlett Packard Model 5890) was employed to determine the compositions of the gas product streams.

The power to heat HCl gas from 293° C. up to dissociation temperature: $P=Cp*(T2-T1)*G+P$ diss HCl (Tables 1) at the consumption of 1 gram per second is shown below in Table 1. Column 9 corresponds to the dissociation temperature generated by a vacuum tube plasma where as Column 10 corresponds to a solid state plasma generator.

TABLE 1

| 1 | 2<br>T, K | 3<br>HCl<br>% | 4<br>HCl<br>% | 5<br>Degree of dissociation<br>1 g HCl/sec<br>W | 6<br>Power of heating<br>1 g HCl/sec<br>W | 7<br>Power of dissociation<br>1 g HCl/sec<br>W | 8<br>Total Power<br>kWH kg 100% | 9<br>kWH kg 50% | 10<br>kWH kg 80% |
|---|---|---|---|---|---|---|---|---|---|
| 1 | 1600 | 99.9 | 0.1 | 1023 | 2.5 | 1026 | 285 | 570 | 356 |
| 2 | 2000 | 98.85 | 1.15 | 1337 | 29 | 1366 | 33 | 66 | 41 |
| 3 | 2200 | 91.20 | 8.8 | 1493 | 223 | 1716 | 5.4 | 10.8 | 6.7 |
| 4 | 2400 | 81.28 | 18.72 | 1650 | 474 | 2124 | 3.15 | 6.3 | 3.9 |
| 5 | 2600 | 69.18 | 30.82 | 1806 | 781 | 2587 | 1.33 | 4.6 | 2.9 |
| 6 | 2800 | 53.70 | 46.3 | 1963 | 1173 | 3136 | 1.87 | 3.7 | 2.34 |
| 7 | 3000 | 37.15 | 62.85 | 2120 | 1592 | 3712 | 1.64 | 3.28 | 2.05 |
| 8 | 3200 | 24.55 | 72.45 | 2276 | 1911 | 4187 | 1.54 | 3.08 | 1.92 |
| 9 | 3400 | 15.49 | 84.51 | 2433 | 2140 | 4574 | 1.5 | 3 | 1.875 |
| 10 | 3600 | 9.77 | 90.23 | 2589 | 2285 | 4875 | 1.5 | 3 | 1.875 |
| 11 | 3800 | 6.16 | 93.84 | 2746 | 2377 | 5123 | 1.516 | 3.03 | 1.895 |
| 12 | 4000 | 3.90 | 96.10 | 2903 | 2434 | 5337 | 1.54 | 3.08 | 1.925 |
| 13 | 4200 | 2.45 | 97.55 | 3059 | 2471 | 5530 | 1.57 | 3.14 | 1.96 |
| 14 | 4400 | 1.55 | 98.45 | 3216 | 2494 | 5710 | 1.61 | 3.22 | 2.01 |
| 15 | 4500 | 1.23 | 98.77 | 3294 | 2502 | 5796 | 1.63 | 3.26 | 2.04 |
| 16 | 4600 | 0.98 | 99.02 | 3372 | 2508 | 5880 | 1.65 | 3.30 | 2.06 |
| 17 | 4800 | 0.62 | 99.38 | 3529 | 2517 | 6046 | 1.69 | 3.38 | 2.11 |

TABLE 1-continued

| 1 | 2 T, K | 4 HCl % | 5 Degree of dissociation HCl % | 3 Power of heating 1 g HCl/sec W | 6 Power of dissociation 1 g HCl/sec W | 7 Total Power 1 g HCl/sec W | 8 kWH kg 100% | 9 kWH kg 50% | 10 kWH kg 80% |
|---|---|---|---|---|---|---|---|---|---|
| 18 | 5000 | 0.39 | 99.61 | 3686 | 2523 | 6209 | 1.73 | 3.46 | 2.16 |
| 19 | 5200 | 0.24 | 99.76 | 3842 | 2527 | 6369 | 1.77 | 3.54 | 2.21 |
| 20 | 5400 | 0.15 | 99.85 | 3999 | 2529.2 | 6528 | 1.82 | 3.64 | 2.27 |
| 21 | 5600 | 0.10 | 99.90 | 4155 | 2530.5 | 6685 | 1.86 | 3.72 | 2.32 |
| 22 | 5800 | 0.06 | 99.94 | 4312 | 2531 | 6843 | 1.90 | 3.8 | 2.375 |
| 23 | 6000 | 0.04 | 99.96 | 4468.6 | 2532 | 7000 | 1.95 | 3.9 | 2.44 |

Tables 2 and 3 show the affects of using a diluent upon the plasma temperature and power required to generate this temperature.

TABLE 2

Heating of gas mixture of (1 Gram of HCl + 1 Gram of Ar) per Second

| Temperature, °K | Power of heating 1 gram of Ar/sec W | Power of heating 1 gram of HCl/sec W | Total power, W |
|---|---|---|---|
| 2,000 | 886 | 1,366 | 2,252 |
| 2,200 | 989.7 | 1,716 | 2,706 |
| 2,400 | 1,094 | 2,124 | 3,218 |
| 3,600 | 1,716 | 4,875 | 6,591 |
| 4,000 | 1,924 | 5,337 | 7,261 |
| 4,500 | 2,183 | 5,796 | 7,979 |
| 5,600 | 2,754 | 6,685 | 9,439 |

TABLE 3

Required Power to heat mixture of Ar and HCl

| Temperature, °K | Power of heating 1 gram of HCl/sec and 1 g Ar/sec, kW | Power of heating 5 grams of HCl/sec, and 5 gr Ar/sec, kW | Power, kW 10 g HCl/sec 10 g Ar/sec |
|---|---|---|---|
| 2,000 | 2.252 | 11.3 | 22.5 |
| 2,200 | 2.7 | 13.5 | 27 |
| 2,400 | 3.22 | 16.1 | 32 |
| 3,600 | 6.59 | 33 | 66 |
| 4,000 | 7.26 | 36.25 | 72.6 |
| 4,500 | 7.979 | 39.9 | 79.8 |
| 5,600 | 9.44 | 47.2 | 94.4 |

When the amount of diluent changes from 1 part of Ar per 1 part of HCl to 0.2 part of argon per 1 part of HCl, the power of heating of argon (refer to Tables 2 and 3) decreases from 1 gram per second up to 4,000° K (1,924 W), such that heating 0.2 gram Ar per second up to a temperature of about 4,000° K requires 385 W. When the amount of diluent changes from normal (ratio 1:1) to 2 parts of Ar per 1 part of HCl, the power of heating of argon (refer to Table 2 and 3) increases from 1 gram per second up to 4,000° K (1,924 W), such that the heating of 2 grams Ar per second up to a temperature of about 4,000° K will require 3,848 W.

The calculation of the power of heating of 1 gram per second of the mixture Ar+HCl is shown below in Table 4.

TABLE 4

| | | Temperature and dissociation | |
|---|---|---|---|
| No. | Composition | Ar:HCl % | 4,000° K.–96.1% Power, W | 5600° K.– 99.9% Power, W |
| 1 | 0.5 Ar + 0.5 HCl | 50:50 | 3,630 | 4,720 |
| 2 | 0.1 Ar + 0.9 HCl | 10:90 | 5,000 | 6,291 |
| 3 | 0.9 Ar + 0.1 HCl | 90:10 | 2,265 | 3,147 |
| 4 | 0.0 Ar + 1.0 HCl | 0:100 | 5,322 | 6,685 |
| 5 | 0.666 Ar + 0.333 HCl | 66.6:33.3 | 3,061 | 4,064 |

Example 1

Experiments 1–6

With reference to FIG. 1, a plasma discharge chamber Model No. PIT20-13CH supplied by Plasma Plus, Inc., Los Angeles, Calif., having an inside diameter of about 45 millimeters was provided. High frequency high voltage power of a frequency of about 13.56 MHz with a plasma discharge power of 10 kW was supplied to the induction coil 4. Argon was introduced into chamber zone 1 through gas mixing chamber 5, and induction plasma discharge was started by a ground tungsten rod. Through gas feed line 7 plasma argon flowed into the discharge chamber 1 gas mixing chamber 5 at a rate of about 1 gram per second. HCl gas was introduced into gas mixing chamber 5 at a rate of about 1 gram per second through gas feed line 6, and was mixed with argon gas to achieve the concentration of HCl in the gas mixture was about 50% as shown below in Table 5. The volume consumptions of the gas reagents were about 2.02 cm. per hour of argon and 2.21 c.m. per hour of HCl. The power of the induction plasma discharge was established at 8.44 Kw and the 5,600° K average temperature of the plasma environment in the discharge chamber 1 was achieved. The mixture of dissociated HCl and argon is fed into quenching water cooler 2 which was an extension of and in communication with chamber 1 and provided the rate of quenching $10^1$ to $10^{5°}$ K/sec., provided by circulating cooling water via inlets 9 and 10. Cooling device 2' was supplied with multiple pipes 8 to provide circulation of coolant therethrough via inlet 19 and outlet 20. A coolant comprising $CO_2$+acetone (–77° C.) was supplied to the cooling device 2' so as to maintain temperature of about (–77° C.), thereby cooling the gas mixture below –34° C., so as to liquefy the chlorine gas, separate the liquid chlorine from gas mixture and collect the liquefied chlorine into trap 18. Gas product zone 5 is equipped with exit line 11 for conveying a gas product stream out of the plasma apparatus via pump 12 and line 13 to a further gas product stream separation and recovery system. Downstream of the plasma generation zone 1, a viewing means 14 is mounted operably connected to spectroscope 15 for measurement of temperature in equilibrium and non-equilibrium conditions of reaction. Gas products zone 3 is equipped with sampling means, e.g., line 16 leading to gas chromatograph 17 determining the composition of the gas product stream produced by cooling the plasmolyzed composition.

Example 2

Experiments 7–12

With reference to FIG. 2, a capacitive plasmatron supplied by Plasma Plus, Inc., Model No. PCT20-13CH. was employed. A plasma discharge chamber having an inside diameter of 45 millimeters was provided. High frequency high voltage power of a frequency of about 13.56 MHz with a plasma discharge power of 10 Kw supplied to the external ring electrodes 21. Argon was introduced into a chamber zone 1 through gas mixing chamber 5, and capacitive plasma discharge was started by the supplying of the high voltage to the electrodes 21. HCl gas was introduced into the gas mixing chamber 5 at various rates through gas feed line 6. The composition of products after the dissociation was similar to the composition presented in Table 5. The advantage of RF capacitive discharge over an RF inductive discharge is higher stability of operation at a lower power of discharge due to lower minimum sustained power. An additional advantage of RF capacitive discharge is substantially non-equilibrium, that is, the temperature of electrons is considerably higher than the temperature of heavy particles that leads to increase of the rate of dissociation.

Example 3

Experiments 13–18

With reference to FIG. 3, the combined induction-capacitive RF plasmatron was employed. A plasma discharge chamber 1 having an internal diameter of 45 millimeters was provided. High frequency high voltage power at a frequency of 13.56 MHz with a plasma discharge power up to 10 kW was supplied to the external ring electrodes 21 and to the inductor 4, which was situated between said electrodes. The power of combined discharge, the composition of plasma components were substantially similar to the parameters described above in Example 1.

The result of experiments corresponded substantially to the results described in Table 5. Combined RF discharge combines the advantages of both inductive and capacitive discharges, but it is more complicated to realize, and the RF plasmatron for this discharge is more expensive.

TABLE 5

Results of experiments at a rate 1 g/sec HCl + 1 g/sec Ar (50% Ar + 50% HCl)

| Experiment # | | | Temperature | Power of RF | Content of HCl |
|---|---|---|---|---|---|
| Induct. | Capac. | Comb. | °K | plasma, kW | % |
| 1 | 7 | 13 | 2,200 | 5.4 | 47 |
| 2 | 8 | 14 | 2,400 | 6.4 | 43 |
| 3 | 9 | 15 | 3,600 | 13.2 | 5 |
| 4 | 10 | 16 | 4,000 | 14.5 | 2 |

TABLE 5-continued

Results of experiments at a rate 1 g/sec HCl + 1 g/sec Ar (50% Ar + 50% HCl)

| Experiment # | | | Temperature | Power of RF | Content of HCl |
|---|---|---|---|---|---|
| Induct. | Capac. | Comb. | °K | plasma, kW | % |
| 5 | 11 | 17 | 4,500 | 16 | 0.7 |
| 6 | 12 | 18 | 5,600 | 19 | 0.3 |

Example 4

Experiments 19–25

RF plasmatrons shown in FIGS. 1, 2, 3 (supplied respectively by Plasma Plus, Inc.) were employed to conduct experiments at various ratio of feed reactants. The results are tabulated below in the Table 6.

TABLE 6

| Exp # | Gases composition and consumption of gases Arg/sec:HCl, g/sec | Power of RF plasma kW Temp = 4,000° K. | Content of HCl % | Power of RF plasma, kW Temp = 5,600° K. | Content of HCl % |
|---|---|---|---|---|---|
| 19 | 0.5    0.5   | 7.2  | 2    | 9.5  | 0.05 |
| 20 | 0.666  0.333 | 6.0  | 1.5  | 8.0  | 0.03 |
| 21 | 0.1    0.9   | 10.0 | 3.5  | 12.6 | 0.09 |
| 22 | 0.9    0.1   | 4.5  | 0.4  | 6.3  | 0.01 |
| 23 | 0.99   0.01  | 4.0  | 0.04 | 5.5  | 0.00 |
| 24 | 0.0    1.00  | 10.7 | 4    | 13.4 | 0.10 |
| 25 | 0.01   0.99  | 10.7 | 4    | 13.4 | 0.10 |

Example 5

Experiments 26–29

With the reference to FIG. 2, the volumes of the discharge chamber and reactor were reduced under vacuum to about 0.01 atm. After starting an RF discharge of low pressure and maintaining the power of discharge about 1 kW, the temperature was measured by using the aforementioned spectroscope method. The changes of HCl dissociation and product mixture composition depending on the plasma composition and power of discharge are presented below in Table 7.

TABLE 7

| Exp # | Composition of the gas mixture Ar: HCl, % | Content of HCl after plasma discharge, % | | | | | |
|---|---|---|---|---|---|---|---|
| | | 2,400° K. | | 15,000° K. | | 30,000° K. | |
| | | g/sec | % | g/sec | % | g/sec | % |
| 26 | 50:50    | 0.5  | 50   | 0.05 | 5  | 0.0001 | <0.1 |
| 27 | 33.3:66.7 | 0.66 | 66.7 | 0.07 | 7  | 0.0001 | <0.1 |
| 28 | 10:90    | 0.9  | 90   | 0.09 | 9  | 0.0001 | <0.1 |
| 29 | 1:99     | 0.99 | 99   | 0.1  | 10 | 0.0001 | <0.1 |

Example 6

Experiments 30–33

With the reference to FIG. 1, the composition of products exiting the plasmatron were altered by changing the quenching time in quenching unit 2. Changes of product composition are presented in below Table 8

TABLE 8

| Exp # | Rate of quenching °K. second | Composition of Product | | | | | | | |
|---|---|---|---|---|---|---|---|---|---|
| | | Ar g/sec | % | HCl g/sec | % | $Cl_2 + H_2$ g/sec | % | $Cl_2$ % wt | $H_2$ % wt |
| 30 | $10^2$ | 0.5 | 50 | 0.4 | 40 | 0.1 | 10 | 5 | 5 |
| 31 | $10^3$ | 0.5 | 50 | 0.05 | 5 | 0.45 | 45 | 22.5 | 22.5 |
| 32 | $10^5$ | 0.5 | 50 | 0.01 | 1 | 0.49 | 49 | 24.5 | 24.5 |
| 33 | $10^7$ | 0.5 | 50 | <0.001 | 0.1 | 0.499 | 49.9 | 24.95 | 24.95 |

Example 7

Experiments 34–36

With the reference to FIG. 1, the residence time of HCl inside the discharge zone, was changed. The results are given in Table 9

TABLE 9

| | Residence time, second | | | | |
|---|---|---|---|---|---|
| Exp. | $10^{-1}$ Ar:HCl, % | $10^{-3}$ Ar:HCl, % | $10^{-5}$ Ar:HCl, % | Temp. °K. | Power of Plasma, kW |
| 34 | 50 :0.01 | 50 :1.0 | 50 :10 | 5,600 | 19.0 |
| 35 | 50 :0.1 | 50 :3.0 | 50 :25 | 4,500 | 16.0 |
| 36 | 50 :1.0 | 50 :6.0 | 50 :45 | 3,600 | 13.2 |

The following is claimed:

1. A process for producing hydrogen and chlorine from hydrogen chloride which comprises the steps of:
   (i) generating a plasma by the use of a radio-frequency plasma generating means;
   (ii) introducing HCl, accompanied by an inert non-oxygenated plasma-forming gas, into said plasma wherein said HCl is heated to a temperature in the range between 2000 degrees K and 6000 degrees K to convert at least a portion of the HCl into its constituents;
   (iii) cooling the constituents to form a gas product mixture comprising $H_2$ and $Cl_2$; and
   (iv) recovering said gas product mixture.

2. The process of claim 1 wherein said HCl is substantially anhydrous.

3. The process of claim 1 wherein said inert gas comprises at least one of Ar, He, Ne, Kr, Xe or their mixture combinations.

4. The process of claim 3 wherein said inert gas comprises Ar.

5. The process of claim 3 wherein said inert gas is present in an amount of from about 0.2 to about 2 parts by weight on the HCl introduced into the plasma.

6. The process of claim 1 wherein the plasma is generated by means of a radio-frequency induction plasma generator comprising an induction coil.

7. The process of claim 1 wherein the plasma is generated by means of a radio-frequency capacitive plasma generator comprising external ring electrodes.

8. The process of claim 1 wherein the plasma is generated by means of a radio-frequency induction-capacitive plasma generator comprising external ring electrodes and an induction coil.

9. The process of claim 1 or 8 wherein the plasma is generated in and contained in a cylindrical dielectric vessel comprising:
   (i) a plasma-generating zone;
   (ii) a cooling zone downstream of said plasma-generating zone adapted to cool the constituents and form the gas product mixture comprising $H_2$ and $Cl_2$; and
   (iii) means for removing the gas product mixture from the vessel.

10. The process of claim 9 wherein the cooling zone comprises a jacketed section of said vessel in association with means for circulating cooling fluid through the jacketed section.

11. The process of claim 9 wherein at least the plasma-generating zone of the cylindrical dielectric vessel comprises at least one member selected from the group consisting of quartz, tantalum, niobium, alloys of Ta with Nb, Re, Os, Mo, Ir, or Ru, or alloys of Nb with Re, Os, Mo, Ir, or Ru.

12. The process of claim 9 wherein the vessel is in operative relationship with a means for detecting the presence of dissociated HCl generated in the plasma-generating zone.

13. The process of claim 9 wherein the vessel is in operative relationship with a means for detecting the presence of molecular $H_2$ and molecular $Cl_2$ in the gas product mixture formed therein.

14. The process of claim 1 or 2 further comprises the step of separating the recovered gas product mixture into a fraction comprising molecular $H_2$ and a fraction comprising molecular $Cl_2$.

15. The process of claim 14 wherein the separation is effected by condensing the gas product mixture to form a liquid or solid condensate fraction comprising $Cl_2$ and a gas fraction comprising $H_2$, and separating the fractions.

16. The process of claim 14 wherein the $Cl_2$ component of the gas product mixture is separated by contacting the mixture with a chemical means that is effective to remove $Cl_2$ and is inert to $H_2$, and the $H_2$ component is separated from the chemical means and recovered.

17. The process of claim 14 wherein said separating comprises at least one of
   a) passing said gas product mixture through a membrane;
   b) condensing said gas product mixture; and
   c) contacting said gas product mixture with an adsorbent.

* * * * *